US00RE37769E

(19) United States
(12) Reissued Patent
Brady et al.

(10) Patent Number: US RE37,769 E
(45) Date of Reissued Patent: Jun. 25, 2002

(54) METHODS FOR FABRICATING MEMORY CELLS AND LOAD ELEMENTS

(75) Inventors: James Brady, Dallas; Tsiu Chiu Chan, Carrollton; David Scott Culver, The Colony, all of TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

(21) Appl. No.: 08/316,035

(22) Filed: Sep. 29, 1994

Related U.S. Patent Documents

Reissue of:
(64) Patent No.: 5,151,387
Issued: Sep. 29, 1992
Appl. No.: 07/516,272
Filed: Apr. 30, 1990

(51) Int. Cl.[7] ..... H01L 21/20
(52) U.S. Cl. ..... 438/385; 438/532; 438/625; 438/647
(58) Field of Search ..... 437/49, 177, 178, 437/189, 191, 193, 195, 200, 43, 192; 148/DIG. 19, DIG. 20, DIG. 147; 438/385, 532, 625, 647

(56) References Cited

U.S. PATENT DOCUMENTS 4,178,674 A 12/1979 Liu et al.
4,180,826 A 12/1979 Shappir (List continued on next page.)

FOREIGN PATENT DOCUMENTS

EP 182610 5/1986
JP 58-135653 8/1983
JP 60-68634 4/1985
JP 62-98660 5/1987

OTHER PUBLICATIONS

Wolf, Stanley, Silicon Processing for the VLSI Era, vol. 2, Lattice Press, Sunset Beach, Calif. (1990), Chapters 3&4.*

IEEE Trans. Electron Dev. vol. 32, No. 9, Sept. 1985, "Ion–Implanted Thin Polycrystalline High–Value Resistors for High–Density Poly–Load Static RAM Applications", Ohzone et al.

IEEE Trans Electron Dev., vol. 40. No. 2, Feb. 1993, "Experimental Characterization of the Diode–Type Polysilicon Loads for CMOS SRAM", Kalnitsky et al., pp. 358–363.

IEEE Trans. Electron Dev., vol. 30, No. 1, Jan. 1993, "Gigaohm–Range Polycrystalline Silicon Resistors for Microelectronic Appn", Mohan et al., pp. 45–51.

IEEE J of Solid State Cir., vol. 18. No. 5, Oct. 1983, "A 4.5 ns Access Time 1K×4 Bit ECL RAM", Nakubo et al., pp. 515–520.

IEEE J. of Solid State Cir, vol. 24, No. 2, Apr. 1989, "A Bipolar ECL Static RAM Using Polysilicon Diode Loaded Memory Cell", Hwang et al., pp. 504–511.

IEEE GaAs IC Symposium, 1984, Hayashi et al., "ECL–Compatible GaAs SRAM Circuit Technology for High Performance Computer Application", pp. 111–114.

(List continued on next page.)

*Primary Examiner*—Kevin Picardat
(74) *Attorney, Agent, or Firm*—David V. Carlson; Lisa K. Jorgenson

(57) ABSTRACT

A contact structure provides electrical contact between two polycrystalline silicon interconnect layers. The lower layer has a silicide layer on its upper surface. The upper polycrystalline silicon layer can be doped with a different conductivity type, and makes an ohmic contact with the silicided region of the lower polycrystalline silicon layer.

20 Claims, 2 Drawing Sheets

U.S. PATENT DOCUMENTS

| | | | | | |
|---|---|---|---|---|---|
| 4,214,917 | A | | 7/1980 | Clark et al. | |
| 4,290,185 | A | | 9/1981 | McKenny et al. | |
| 4,322,821 | A | * | 3/1982 | Lohstroh et al. | |
| 4,367,580 | A | | 1/1983 | Guterman | |
| 4,370,798 | A | | 2/1983 | Lien et al. | |
| 4,398,335 | A | * | 8/1983 | Lehrer | 437/192 |
| 4,505,026 | A | | 3/1985 | Bohr et al. | |
| 4,535,427 | A | | 8/1985 | Jiang | |
| 4,554,729 | A | | 11/1985 | Tanimura et al. | |
| 4,560,419 | A | | 12/1985 | Bourassa et al. | |
| 4,561,907 | A | | 12/1985 | Raicu | |
| 4,562,640 | A | * | 1/1986 | Widmann et al. | 437/189 |
| 4,581,623 | A | * | 4/1986 | Wang | 437/48 |
| 4,617,071 | A | * | 10/1986 | Vora | 437/55 |
| 4,619,037 | A | | 10/1986 | Taguchi et al. | |
| 4,654,824 | A | * | 3/1987 | Thomas et al. | |
| 4,658,378 | A | | 4/1987 | Bourassa | |
| 4,675,715 | A | * | 6/1987 | Lepselter et al. | |
| 4,677,735 | A | * | 7/1987 | Malhi | 437/34 |
| 4,714,685 | A | * | 12/1987 | Schubert | 437/41 |
| 4,792,923 | A | * | 12/1988 | Nakase et al. | 365/154 |
| 4,804,636 | A | * | 2/1989 | Groover, III et al. | |
| 4,831,424 | A | * | 5/1989 | Yoshida et al. | |
| 4,849,344 | A | * | 7/1989 | Desbiens et al. | 437/41 |
| 4,870,033 | A | * | 9/1989 | Hotta et al. | 437/192 |
| 4,874,719 | A | * | 10/1989 | Kurosawa | 437/195 |
| 4,877,483 | A | | 10/1989 | Bergemont et al. | |
| 4,903,096 | A | | 2/1990 | Masuoka et al. | |
| 4,907,052 | A | | 3/1990 | Takada et al. | |
| 4,922,455 | A | | 5/1990 | Chinn et al. | |
| 4,933,735 | A | * | 6/1990 | Potash et al. | |
| 4,948,747 | A | * | 8/1990 | Pfiester | 437/60 |
| 4,950,620 | A | | 8/1990 | Harrington, III | |
| 4,966,864 | A | | 10/1990 | Pfiester | |
| 4,968,645 | A | | 11/1990 | Baldi et al. | |
| 5,021,849 | A | | 6/1991 | Pfiester et al. | |
| 5,107,322 | A | | 4/1992 | Kimura | |
| 5,151,376 | A | | 9/1992 | Spinner, III | |
| 5,187,114 | A | | 2/1993 | Chan et al. | |
| 5,196,233 | A | | 3/1993 | Chan et al. | |

OTHER PUBLICATIONS

IEEE J. of Solid State Cir, vol. 21, No. 5, Oct. 1986, "A 1.0–ns 5–Kbit ECL RAM", Chuang et al., pp. 670–674.

Physics of Semiconductors, S.M. Sze, 1981, pp. 304–305.

Solid State Elect, vol. 30, No. 3, pp. 339–343, 1987, "Characterization of Aluminum/LPCVD Polysilicon Schottky Barrier Diodes", Chen et al.

Solid State Elect., vol. 28 No. 12, pgs. 1255–1261 1985 "Field Enhanged Emission and Capture in Polysilicon pn Junctions", Greve et al.

Solid State Electronics, vol. 15, pp. 1103–1106, 1972, "P–N junctions in Polycrystalline Silicon Films," Manoliu et al.

1989 Symposium on VLSI Technology, Digest of Technical Papers, pp. 61–62, May 22–25, "A New Process Technology for a 4Mbit SRAM with Polysilicon Load Resistor Cell", Yuzuriha et al.

Silicon Processing for the VLSI Era, vol. 2–Process Integration, pp. 84–85, 176–177, x–xv, 1986, Wolf.

* cited by examiner

METHODS FOR FABRICATING MEMORY CELLS AND LOAD ELEMENTS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention is related generally to integrated circuits, and more specifically to a contact between different layers of polycrystalline silicon interconnect.

2. Description of the Prior Art

In semiconductor circuits, it is known that ohmic contacts are desirable between interconnect layers. An ohmic contact is one in which no P-N junction is formed.

When polycrystalline silicon interconnect lines having different conductivity types make contact, a P-N junction is formed. A similar junction can be formed when polycrystalline silicon having the same conductivity type, but very different doping levels (such as $N^{--}$ *to* $N^{+}$) make contact. For various reasons, it is often desirable to have interconnect having different conductivity types make contact, and it would be desirable to provide an ohmic contact for such structures.

SUMMARY OF THE INVENTION

It is therefore an object of the present invention to provide an ohmic contact between polycrystalline silicon interconnect layers having different conductivity types.

It is another object of the present invention to provide such a contact which is easily formed with a process compatible with existing process technologies.

It is a further object of the present invention to provide such a contact which is suitable for use in an SRAM structure to provide a load.

Therefore, according to the present invention, a contact structure provides electrical contact between two polycrystalline silicon interconnect layers. The lower layer has a silicide layer on its upper surface. The upper polycrystalline silicon layer can be doped with a different conductivity type, and makes the ohmic contact with the silicided region of the lower polycrystalline silicon layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
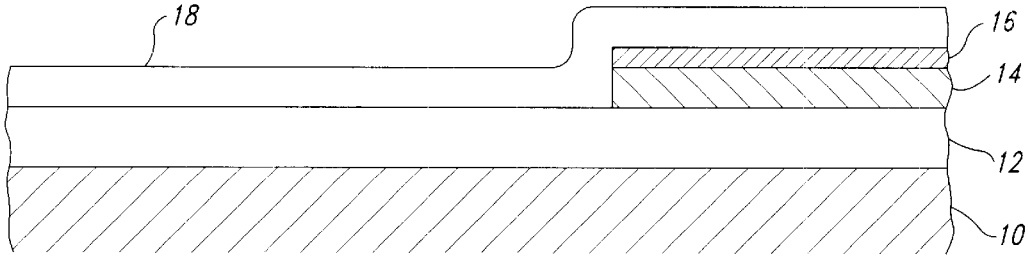
FIGS. 1–3 illustrate a preferred method for forming a contact according to the present invention.

Referring to FIG. 1, a semiconductor substrate 10 is partially covered with an oxide layer 12. The oxide layer 12 is not complete over the entire surface of the substrate 10, but that portion of interest to the present description has no openings to the substrate 10.

A polycrystalline silicon layer 14 lies on the oxide layer 12. In the illustrative embodiment, layer 14 is doped N-type. The polycrystalline silicon layer 14 has been silicided to form a silicide layer 16 thereon. The polycrystalline silicon 14 and silicide layer 16 have been patterned in a previous processing step as known in the art to form a signal line. The polycrystalline silicon layer 14 may be a first polycrystalline silicon layer, such as commonly used to form gate electrodes of field effect devices. Alternatively, polycrystalline silicon layer 14 may be a second or later level used for interconnect between different portions of an integrated circuit device. At the processing stage shown in FIG. 1, the transistors of the device have already been formed.

Once the polycrystalline silicon and silicide layers 14, 16 have been formed and patterned, an oxide layer 18 is formed over the surface of the device. Oxide layer 18 is typically a thin oxide layer, having a thickness of between 500 and 1000 angstroms. The thickness of oxide layer 18 may be any thickness which is compatible with the fabrication process with which the invention described herein is being used.

Figure 2:
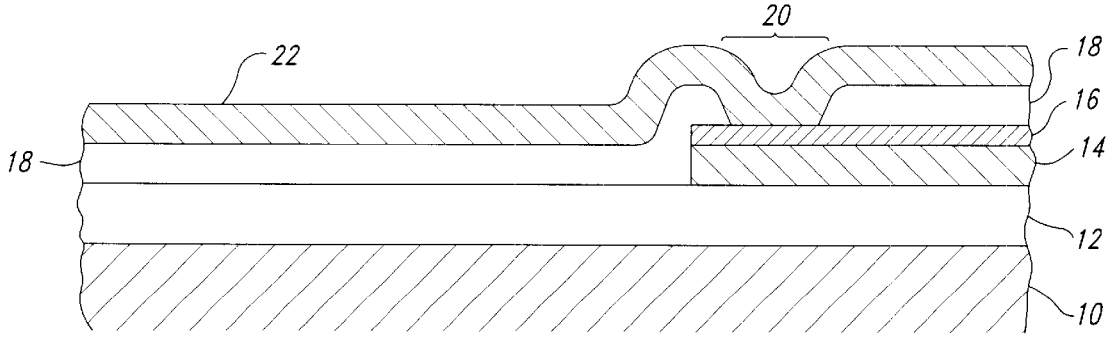

Referring to FIG. 2, oxide layer 18 is patterned and etched to define a contact opening 20 to the upper surface of the silicide layer 16. A layer of polycrystalline silicon 22 is then deposited over the surface of the device.

A light dosage of boron is implanted into the polycrystalline silicon layer 22 in order to convert it to a P-type conductor. A typical dosage would be approximately $10^{13}$ atoms/cm$^2$.

Figure 3:
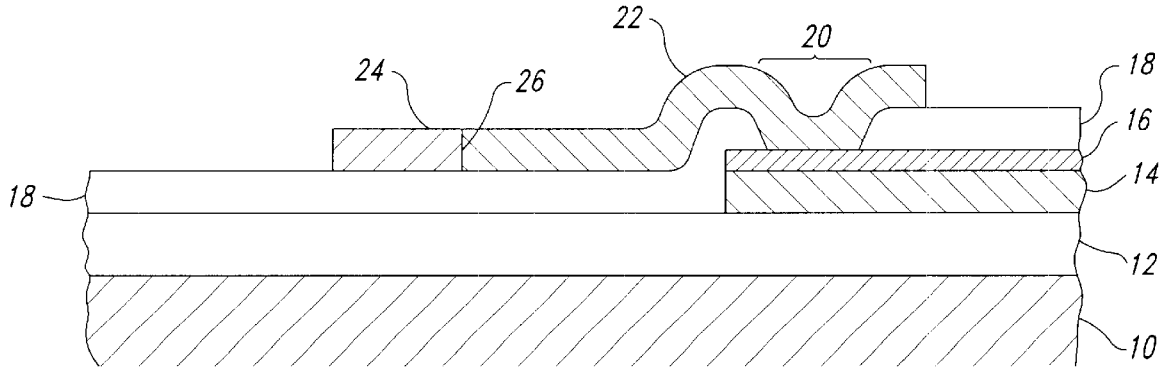

Referring to FIG. 3, the polycrystalline silicon layer 22 is then masked, and a heavy arsenic implant made to define an $N^+$region 24. A typical dosage for such implant is $5\times10^{15}$ atoms/cm$^2$. Such doping level is used to allow the $N^+$region 24 to be used as a power supply line.

A P-N junction 26 is formed at the interface between the $N^+$region 24 and the lightly P-doped polycrystalline silicon layer 22. The doping of polycrystalline silicon layer 22 is low enough to define a resistor, but is sufficiently high to cause degeneration in the contact opening 20, providing an ohmic contact between the polycrystalline silicon layer 22 and the silicide layer 16. Thus, although the polycrystalline silicon layer 14 is N-type, no P-N junction is formed at the contact between the two layers 14, 22.

After formation of the highly doped $N^+$regions 24, the polycrystalline silicon layer 22 is etched to define interconnect, leaving the structure shown in FIG. 3. The device is then ready for formation of further oxide and interconnect levels as desired.

Figure 4:
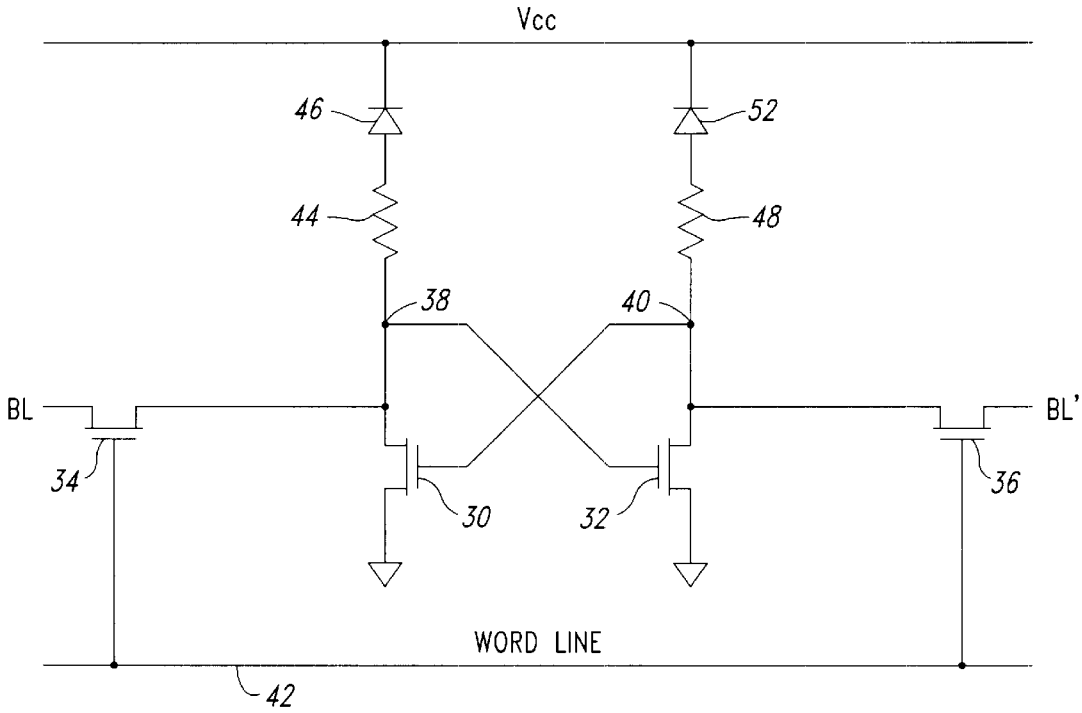
FIG. 4 is a schematic diagram of the SRAM cell utilizing an ohmic contact formed according to the present invention.

Referring to FIG. 4, a 4-transistor SRAM cell is shown. The contact structure formed in FIG. 1–3 is suitable for use as a load element in the cell of FIG. 4.

Cross-coupled field effect devices 30, 32 form the basis of the SRAM cell. Access transistors 34, 36 connect the bit line BL and complemented bit line BL' to common nodes 38, 40, respectively. Access transistors 34, 36 are driven by the word line 42 as known in the art. Node 38 is connected to the power supply line $V_{cc}$ through resistor 44 and diode 46. Node 40 is connected to $V_{cc}$ through resistor 48 and diode 50.

Node 38 corresponds to contact opening 20 in FIG. 3. Resistor 44 corresponds to polycrystalline silicon region 22 of FIG. 3, with diode 46 being formed at the junction 26. Node 40, resistor 48, and diode 50 correspond to FIG. 3 in a similar manner.

Since the contact at contact opening 20, corresponding to nodes 38 and 40, is an ohmic contact, the load for the SRAM cell is formed by a resistor and a diode rather than back-to-back polycrystalline silicon diodes. In some SRAM cell designs, this can provide improved performance over the use of a resistor alone, or back-to-back polycrystalline silicon diodes.

A similar ohmic contact can be formed between a lower polycrystalline silicon layer which is doped P-type and an upper N-type layer. The silicide layer prevents formation of a P-N junction in the contact opening.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact in a semiconductor integrated circuit device, comprising the steps of:

forming a first polycrystalline silicon interconnect layer having a first conductivity type;

forming a silicide layer on the first polycrystalline silicon interconnect layer;

forming an insulating layer over the entire device;

forming a contact opening in the insulating layer, wherein a contact region on an upper surface of the silicide layer is exposed;

forming a second polycrystalline silicon interconnect layer having a second conductivity type over the insulating layer, wherein the second polycrystalline silicon interconnect layer makes ohmic contact with the silicide layer through the contact opening.

2. The method of claim 1, wherein the first and second conductivity types are the same type, and wherein the second polycrystalline silicon interconnect layer is lightly doped relative to the first polycrystalline silicon interconnect layer.

3. The method of claim 1, wherein the first and second conductivity types are of opposite types.

4. The method of claim 1, wherein the first and second conductivity types are the same type, and wherein the first polycrystalline silicon interconnect layer is lightly doped relative to the second polycrystalline silicon interconnect layer.

5. The method of claim 3, wherein the first conductivity type is N-type, and the second conductivity type is P-type.

6. The method of claim 3, wherein the first conductivity type is P-type, and the second conductivity type is N-type.

7. A method for forming a contact in a semiconductor integrated circuit device, comprising the steps of:

forming a first polycrystalline silicon interconnect lyar having a first conductivity type;

forming a silicide layer on the first polycrystalline silicon interconnect layer;

forming an insulating layer over the entire device;

forming a contact opening in the insulating layer, wherein a contact region on an upper surface of the silicide layer is exposed;

forming a second polycrystalline silicon interconnect layer having a second conductivity type opposite to the first conductivity type over the insulating layer, wherein the second polycrystalline silicon interconnect layer makes ohmic contact with the silicide layer through the contact opening; and forming a region having the first conductivity type within the second polycrystalline silicon interconnect layer at a location spaced from the contact opening, wherein a P-N junction is formed within the second polycrystalline silicon interconnect layer.

*8. A method of fabricating an SRAM cell, comprising the steps of:*

*fabricating first and second driver transistors and first and second pass transistors, said driver transistors each being N-channel field-effect transistors and having respect gates, sources, and drains;*

*connecting said gate of said driver transistor to said drain of second driver transistor, and connecting said gate of said second driver transistor to said drain of said first driver transistor, using a polycide layer comprising a lower polysilicon portion which is doped n-type polysilicon and an upper silicide portion;*

*providing an additional patterned polysilicon layer which includes both heavily doped n-type regions and lightly doped p-type regions,*

*said heavily doped n-regions of said additional polysilicon layer being connected directly to a positive power supply voltage, and*

*said lightly doped p-type regions of said additional polysilicon layer making ohmic contact directly to said silicide portion of said polycide layer to provide pull-up connections to said drains of said driver transistors.*

*9. A product made by the method of claim 1.*

*10. A product made by the method of claim 7.*

*11. A product made by the method of claim 8.*

*12. The method of claim 1, wherein said insulating layer has a thickness in the range of 500–1000 Å.*

*13. The method of claim 1, wherein said second polycrystalline silicon interconnect layer includes $10^{13}$ $cm^{-2}$ implanted atoms of dopant.*

*14. The method of claim 1, wherein said first polycrystalline silicon interconnect layer includes about $5\times10^{15}$ $cm^{-2}$ implanted atoms of dopant.*

*15. The method of claim 7, wherein the first and second conductivity types are of opposite types.*

*16. The method of claim 7, wherein said insulating layer has a thickness in the range of 500–1000 Å.*

*17. The method of claim 7, wherein said second polycrystalline silicon interconnect layer, other than said region having the first conductivity type, includes $10^{13}$ $cm^{-2}$ implanted atoms of dopant.*

*18. The method of claim 8, wherein said additional patterned polysilicon layer includes $10^{13}$ $cm^{-2}$ implanted atoms of dopant.*

*19. The method of claim 8, wherein said polycide layer includes about $5\times10^{15}$ $cm^{-2}$ implanted atoms of dopant.*

*20. The method of claim 8, wherein said additional patterned polysilicon layer overlies an oxide layer which has a thickness in the range of 500–1000 Å.*

* * * * *